US012013258B2

(12) United States Patent
Zethraeus

(10) Patent No.: US 12,013,258 B2
(45) Date of Patent: Jun. 18, 2024

(54) SENSOR ASSEMBLY FOR A VEHICLE

(71) Applicant: ELONROAD AB, Lund (SE)

(72) Inventor: Dan Zethraeus, Lund (SE)

(73) Assignee: ELONROAD AB, Lund (SE)

( * ) Notice: Subject to any disclaimer, the term of this patent is extended or adjusted under 35 U.S.C. 154(b) by 157 days.

(21) Appl. No.: 17/638,877

(22) PCT Filed: Aug. 27, 2020

(86) PCT No.: PCT/EP2020/073969
§ 371 (c)(1),
(2) Date: Feb. 28, 2022

(87) PCT Pub. No.: WO2021/037977
PCT Pub. Date: Mar. 4, 2021

(65) Prior Publication Data
US 2022/0316923 A1    Oct. 6, 2022

(30) Foreign Application Priority Data

Aug. 30, 2019   (SE) ................................... 1950986-8

(51) Int. Cl.
| G01D 11/24 | (2006.01) |
| B60R 11/00 | (2006.01) |
| B60R 11/04 | (2006.01) |
| G02B 27/00 | (2006.01) |
| H05K 7/20  | (2006.01) |

(52) U.S. Cl.
CPC ............ *G01D 11/245* (2013.01); *B60R 11/04* (2013.01); *G02B 27/0006* (2013.01); *H05K 7/20009* (2013.01); *B60R 2011/004* (2013.01)

(58) Field of Classification Search
CPC .............. B60R 2011/004; B60R 11/04; H05K 7/20009; G02B 27/0006; G01D 11/245
See application file for complete search history.

(56) References Cited

U.S. PATENT DOCUMENTS

| 2012/0162428 A1 | 6/2012 | Wee |
| 2014/0104426 A1* | 4/2014 | Boegel .................... B60R 11/04 |
| | | 348/148 |

(Continued)

FOREIGN PATENT DOCUMENTS

| JP | 6429350 B1 | 11/2018 |
| WO | 2015/079634 A1 | 6/2015 |

OTHER PUBLICATIONS

International Search Report from International Application No. PCT/EP2020/073969 dated Oct. 23, 2020.

(Continued)

*Primary Examiner* — Xi Wang
(74) *Attorney, Agent, or Firm* — Shih IP Law Group, PLLC

(57) ABSTRACT

The present invention relates to a sensor assembly configured to be mounted on a vehicle. The sensor assembly comprises a sensor; and a housing housing the sensor. The housing comprises an inclined front wall configured to face a main traveling direction (A) of the vehicle and a direction (B) away from the vehicle, a vehicle facing wall configured to face towards the vehicle, the vehicle facing wall comprising an air inlet, and a rear openings forming a viewing opening for the sensor, the rear opening being in fluid connection with the air inlet such that air entering the air inlet exits the housing through the rear opening.

8 Claims, 4 Drawing Sheets

(56) References Cited

U.S. PATENT DOCUMENTS

| | | | |
|---|---|---|---|
| 2015/0015713 A1* | 1/2015 | Wang | H04N 23/70 |
| | | | 348/148 |
| 2016/0272163 A1* | 9/2016 | Dreiocker | H04N 23/811 |
| 2017/0028936 A1* | 2/2017 | Matsumoto | B62D 37/02 |
| 2017/0305360 A1 | 10/2017 | Zajac | |
| 2018/0058713 A1 | 3/2018 | Spors | |

OTHER PUBLICATIONS

English translation of JP Office Action mailed Jan. 26, 2024 from JP Application No. 2022-513415, 6 pages.

* cited by examiner

SENSOR ASSEMBLY FOR A VEHICLE

CROSS-REFERENCE TO RELATED APPLICATION

This Application is the National Stage filing under 35 U.S.C. § 371 of PCT Application Ser. No. PCT/EP2020/073969 filed on Aug. 27, 2020, which claims the benefit of European Patent Application No. 1950986-8 filed on Aug. 30, 2019. The disclosures of both applications are hereby incorporated herein by reference in their entireties.

TECHNICAL FIELD

The present inventive concept relates to a sensor assembly configured to be mounted on a vehicle.

BACKGROUND

Over the past years, vehicles such as fuel cars and electric cars have developed rapidly. The new generations of vehicles are more equipped with various types of sensors and cameras. Such various types of sensors and cameras allow sensing of the vehicle environment. The sensing of the vehicle environment becomes extremely important when it comes to autonomous cars.

Nowadays, the use of various types of sensors and cameras on vehicles is limited by their cleanness, as they may e.g. become muddied by adverse weather condition. Therefore, there is a need to protect them against dirt and keep them clean.

SUMMARY

An objective of the present inventive concept is to address this need. Further and alternative objectives may be understood from the following.

According to a first aspect a sensor assembly is provided. The sensor assembly is configured to be mounted on a vehicle, the sensor assembly comprises a sensor; and a housing housing the sensor. The housing comprises an inclined front wall configured to face a main traveling direction of the vehicle and a direction away from the vehicle, a vehicle facing wall configured to face towards the vehicle, the vehicle facing wall comprises an air inlet, and a rear opening forming a viewing opening for the sensor. The rear opening is in fluid connection with the air inlet such that air entering the air inlet exits the housing through the rear opening.

The inclined front wall of the housing, facing towards the vehicle, faces a wind created by a speed of the vehicle upon driving the vehicle in the main traveling direction. The inclined front wall guides or reflects at least a portion of the wind to the direction away from the vehicle due to its inclination. Thereby, an air pressure around the rear opening of the hosing becomes less than an air pressure of the wind hitting the inclined front wall of the housing. This creates an under-pressure around the rear opening of the hosing and causes the air to be sucked into the housing via the air inlet such that air enters the housing from the air inlet and exits the housing from the rear opening. As a result, the sensor may be protected against dirt such as mud and other particles. Further, the sensor may be protected against humidity since the air exiting the rear opening may prevent water droplets from reaching the sensor and hence sticking on the sensor. Thereby, the inventive sensor assembly may provide a simple and a maintenance-free solution for keeping the sensor clean.

By a sensor is hereby meant a sensing device configured to sense a vehicle surrounding. For instance, the sensor may be a camera configured to capture a video stream of the vehicle surrounding. According to other examples, the sensor may comprise one or more of the following: a lidar, a radar, an ultra-sonic sensor, a laser sensor, a passive infrared sensor (PIR), a smoke sensor, a fire sensor, and a temperature sensor. By a housing is hereby meant something that covers or protects the sensor, such as a case or enclosure. By an air inlet is hereby meant an opening for air to pass through.

The housing may further comprise a filter configured to filter air entering the air inlet. The air being sucked into the air inlet may hence be filtered by the filter. Thereby, the air exiting the housing through the rear opening and around the sensor may be clean air free from dirt and/or moisture.

The rear opening of the housing may circumferentially enclose the sensor. Thereby, air may exit via the rear opening circumferentially around the sensor. Hence, a volume of clean air may surround the sensor.

A cross-sectional dimension of the rear opening may at least be twice a cross-sectional dimension of the sensor. Thereby, a volume of clean air exiting the rear opening may be large enough to protect the sensor from dirty ambient air.

By a cross-sectional dimension of the rear opening is hereby meant a minimum size of the rear opening in directions perpendicular to the main traveling direction of the vehicle. By a cross-sectional dimension of the sensor is hereby meant a maximum size of the sensor in directions perpendicular to the main traveling direction of the vehicle.

An area of the air inlet may at least be 50% to 80% of the cross-sectional dimension of the rear opening. Hence, it may be secured that enough air enters the air inlet.

By an area of the air inlet is hereby meant a combined area of the opening/openings constituting the air let allowing the air being sucked into the housing.

The inclined front wall may have an angle in a range from 10° to 40° with respect to the main travelling direction of the vehicle. Thereby, the inclined front wall guides or reflects at least a portion of the air to the direction away from the vehicle due to its inclination. In addition, the inclination of the inclined front wall may facilitate the air flow through the housing. Furthermore, the angle range of 10° to 40° may prevent or at least mitigate formation of vortex in the housing and may facilitate a laminar air flow in the housing.

The air inlet may comprise a plurality of openings. Thereby, the air inlet may provide a support surface for the filter. Also, the air inlet may itself act as a filter by filtering particles larger that a size of openings.

The housing may further comprise at least a mounting bracket positioned at a distance from the rear opening, the distance preferably being at least 10% of a cross-sectional dimension of the rear opening. The sensor may hence be mounted at the distance from the rear opening. It may hence be safeguarded that the volume of clean air surrounds the sensor keeping the sensor clean. Further, thereby the sensor may be enclosed and protected by the rear opening. For instance, in the case of the camera, a lens of the camera may be protected against small rocks and stones from the road that get knocked up from wheels or other cars.

The housing may further comprise side walls connecting the inclined front wall and the vehicle facing wall. The side walls may facilitate formation of a closed channel for the air passing through the housing.

The air inlet may be configured to be connected to an inside of the vehicle such that air entering the housing may be taken from the inside of the vehicle.

A further scope of applicability of the present invention will become apparent from the detailed description given below. However, it should be understood that the detailed description and specific examples, while indicating preferred embodiments of the invention, are given by way of illustration only, since various changes and modifications within the scope of the invention will become apparent to those skilled in the art from this detailed description.

Hence, it is to be understood that this invention is not limited to the particular portions and parts of the assembly described as such portions and parts may vary. It is also to be understood that the terminology used herein is for purpose of describing particular embodiments only, and is not intended to be limiting. It must be noted that, as used in the specification and the appended claim, the articles "a," "an," "the," and "said" are intended to mean that there are one or more of the elements unless the context clearly dictates otherwise. Thus, for example, reference to "a sensor" or "the sensor" may include several devices, and the like. Furthermore, the words "comprising", "including", "containing" and similar wordings does not exclude other elements or steps.

BRIEF DESCRIPTION OF THE DRAWINGS

The above and other aspects of the present invention will now be described in more detail, with reference to appended drawings showing embodiments of the invention. The figures should not be considered limiting the invention to the specific embodiment; instead they are used for explaining and understanding the invention.

As illustrated in the figures, the sizes are exaggerated for illustrative purposes and, thus, are provided to illustrate the general structures of embodiments of the present invention. Like reference numerals refer to like elements throughout.

DETAILED DESCRIPTION

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and to fully convey the scope of the invention to the skilled person.

Figure 1:
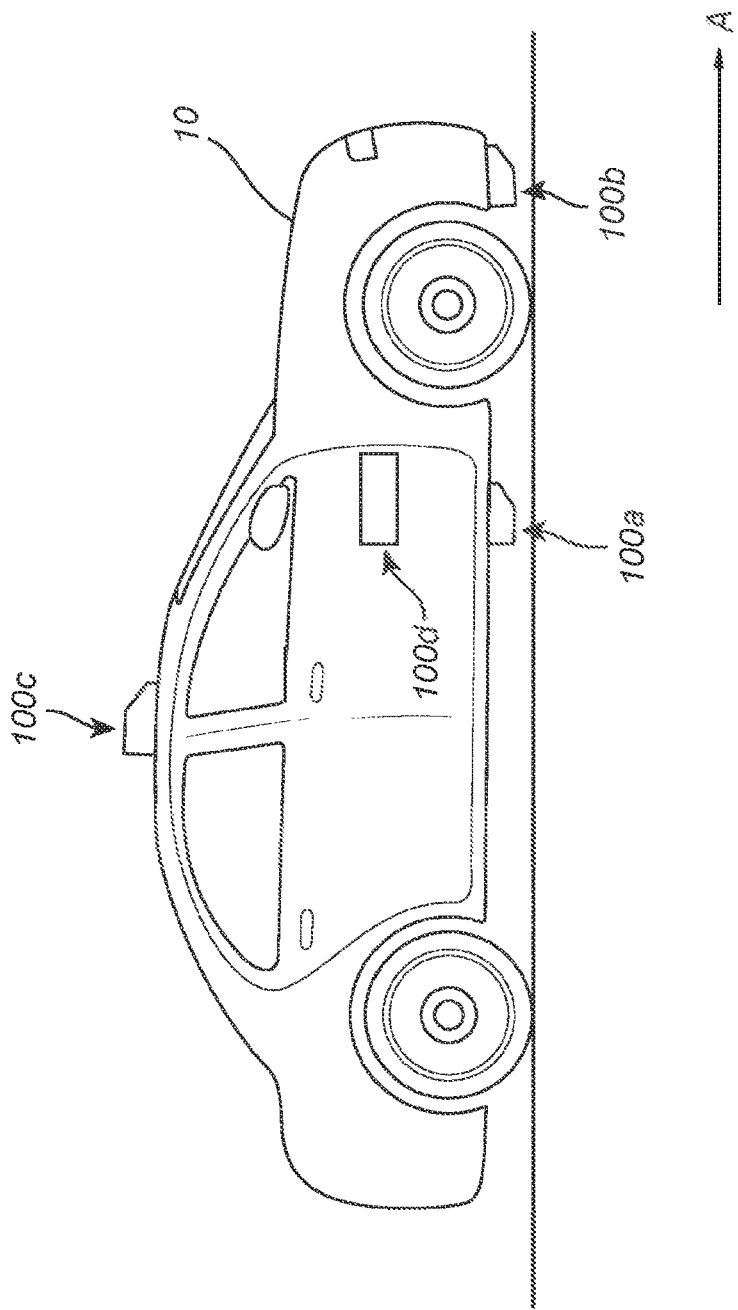
FIG. 1 is a side view of a vehicle comprising a sensor assembly.

In connection with FIG. 1, a vehicle 10 is shown. The vehicle 10 may, as illustrated in FIG. 1, be a car. However, the vehicle may be any other kind of vehicle, such as a truck, a buss, a tractor, a boat, etc. The vehicle 10 has a main traveling direction A. The main traveling direction A may also be referred to as a forward travelling direction of the vehicle 10.

In connection with FIG. 1 four sensor assemblies 100a, 100b, 100c, 100d are mounted on the vehicle 10. It is understood that a vehicle 10 may have fewer or more sensor assemblies mounted thereon. FIG. 1 illustrates that a sensor assembly may be mounted at different positions of the vehicle 10. For example, a sensor assembly 100a, 100b may be mounted under the vehicle 10, such as under a middle portion of the vehicle 10 (sensor assembly 100a) and/or under a front portion of the vehicle 10 (sensor assembly 100b). According to another example, the sensor assembly 100c may be mounted on top of the vehicle 10. According to yet another example, the sensor assembly 100d may be mounted on a side of the vehicle 10.

Figure 2:
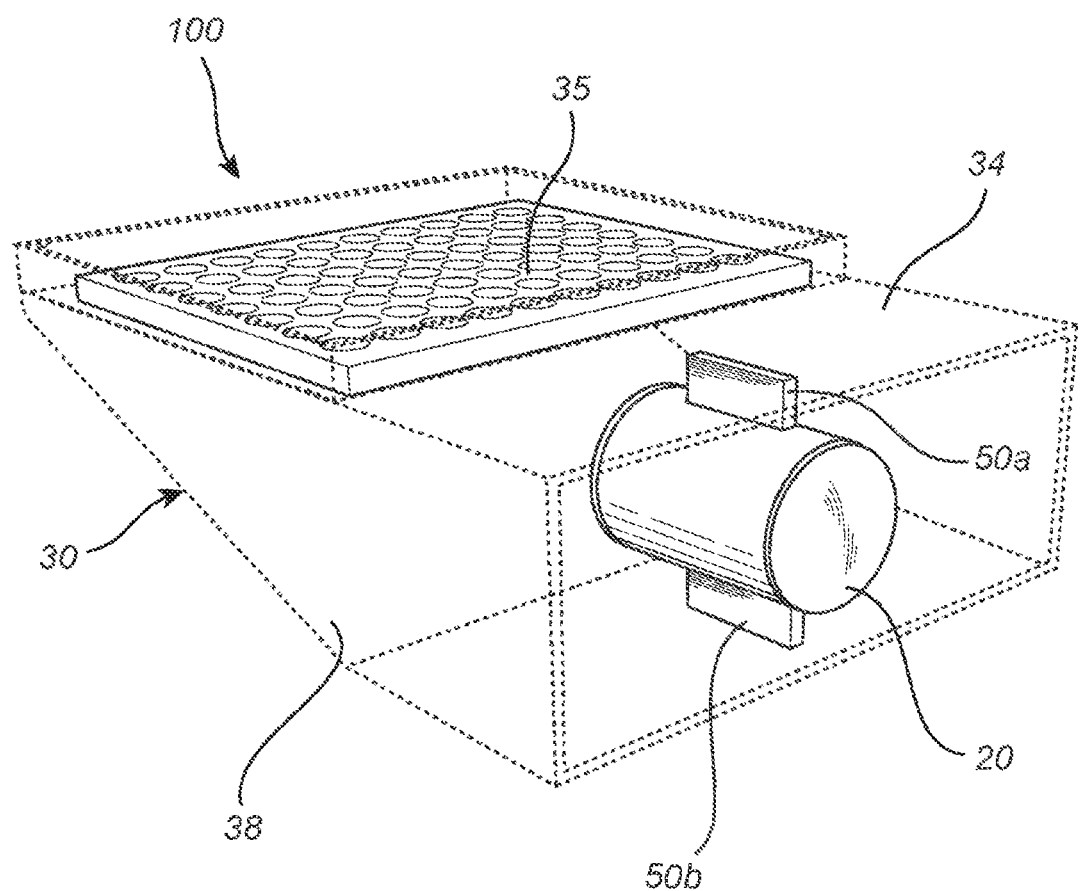
FIG. 2 is a perspective view of a sensor assembly configured to be mounted on a vehicle.
Figure 3:
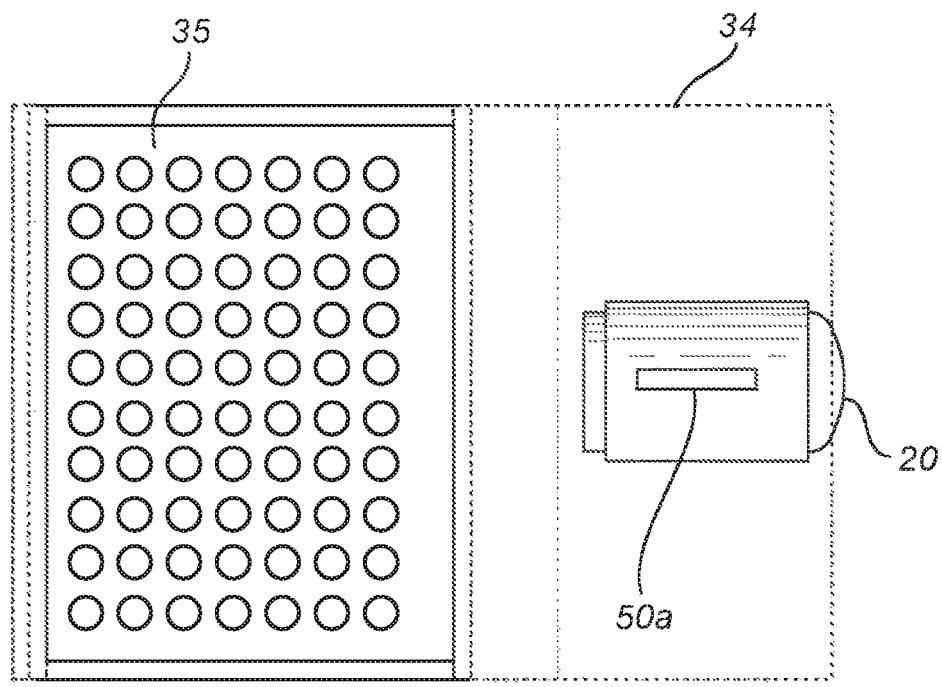
FIG. 3 is a top view of the sensor assembly of FIG. 2.
Figure 4:
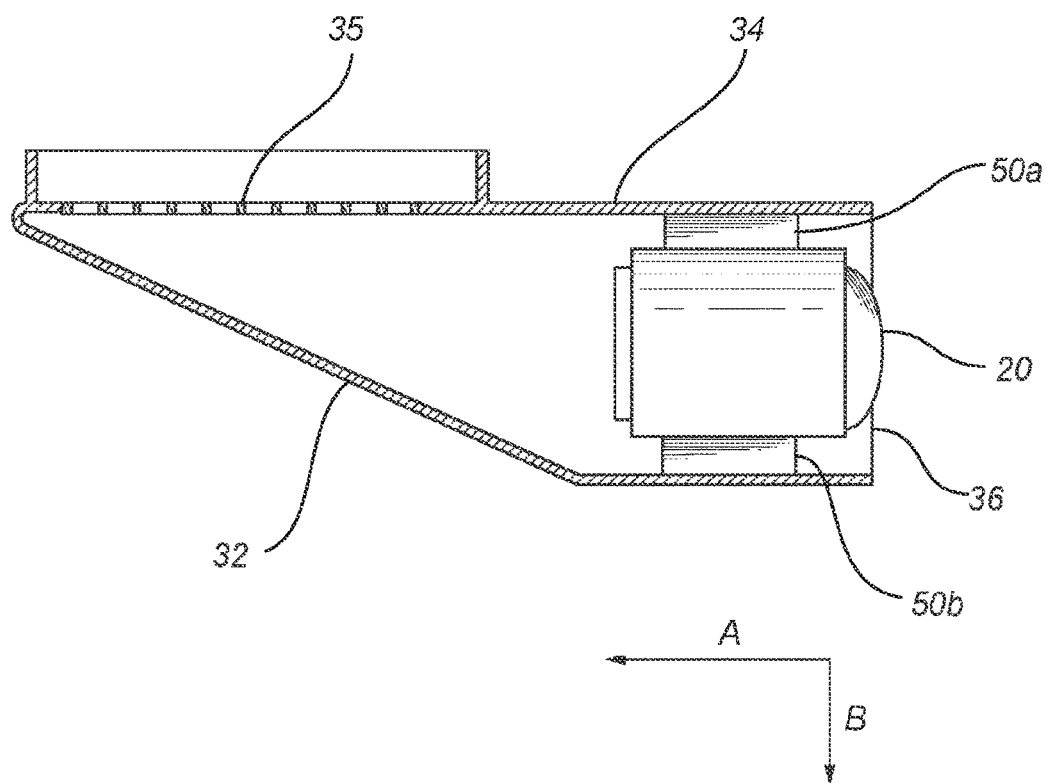
FIG. 4 is a side view of the sensor assembly of FIG. 2.
Figure 5:
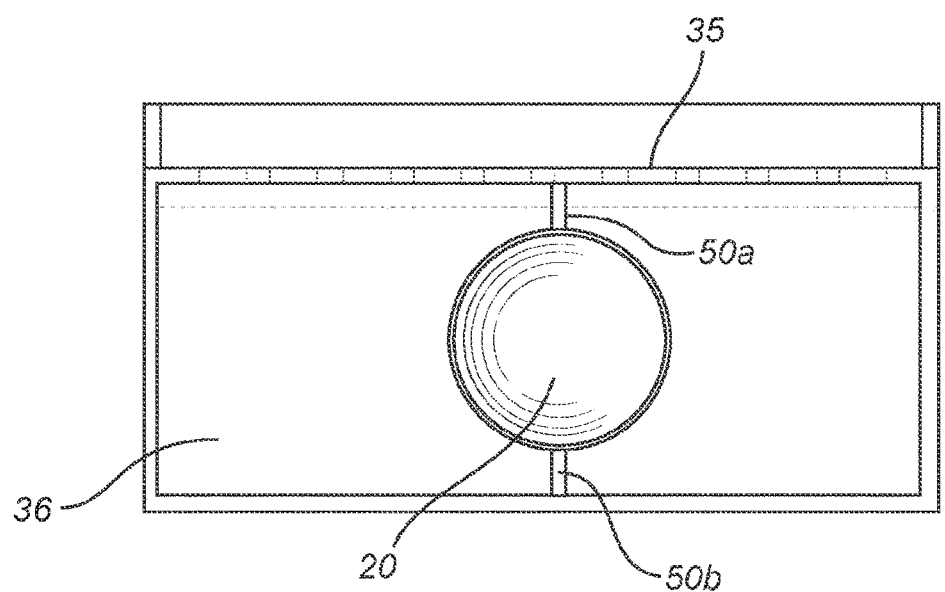
FIG. 5 is a rear view of the sensor assembly of FIG. 2.

In connection with FIG. 2, a perspective view of sensor assembly 100 is shown. FIGS. 3-5 show a top view, a side view and a rear view of the sensor assembly 100 shown in FIG. 2, respectively. The sensor assembly 100 comprises a sensor 20 and a housing 30. The sensor 20 may send and/or receive information from information sending units arranged along a road. An example of such sensors is a PIR sensor used for motion detection. Other examples of such sensors are lidar, radar, ultra-sonic, temperature, smoke, fire, laser and Infra-Red (IR) sensors. The sensor 20 may be a camera viewing the vehicle surrounding. The sensor 20 will hereinafter be referred to as a camera 20. However, the sensor 20 is not limited to a camera 20 and may be any sensor 20 configured on a vehicle 10 which needs to be kept clean. According to other examples, the sensor may comprise one or more of the following: a lidar, a radar, an ultra-sonic sensor, and a temperature sensor.

The camera 20 may provide a view of the vehicle surrounding when the vehicle 10 is parked or driving. The camera 20, in the case the sensor assembly 100 is mounted under the vehicle 10, may provide a view of under the vehicle 10. For instance, the camera 20 may view an animal under the vehicle 10 when the vehicle 10 is parked. The camera may be equipped with an IR lighting. Therefore, the camera 20 may automatically detect even cold objects moving under the vehicle 10. The camera may further be equipped with a fire sensor for fire detection. The camera 20 may capture a video stream of the vehicle environment. For instance, if the sensor assembly 100 is mounted under the vehicle 20, the camera 20 may provide a video stream of a road where the vehicle 10 is driving on. Data obtained by the camera 20 may be used to navigate, control, or drive the vehicle 10.

The housing 30 houses the camera 20. The housing 30 may be formed of a material resistant to temperature variation and humidity. The housing may be formed of an electromagnetic compatible material. The housing 30 may for instance be formed of metal. Examples of such metal are aluminum, steel, and stainless steel.

The housing 30 comprises an inclined front wall 32 facing at least two directions. The inclined front wall 32 of the housing 30 faces a main traveling direction A of the vehicle 10. The inclined front wall 32 of the housing 30 also faces a direction B away from the vehicle 10. For instance, in the case of the sensor assembly 100 is mounted under the vehicle 10, the inclined front wall 32 faces the main traveling direction A of the vehicle and the road. Another example, in the case of the sensor assembly 100c is mounted above the vehicle 10, the inclined front wall 32 faces the main travelling direction A and the sky. The inclined front wall 32 may have an angle in a range from 10° to 40° with respect to the main travelling direction A of the vehicle 10.

The housing 30 further comprises a vehicle facing wall 34 configured to face towards the vehicle 10. The vehicle facing wall 34 may be a flat wall. The vehicle facing wall 34 may be slightly inclined with an angle in a range of 0° to 20° with respect to the main travelling direction of the vehicle 10. The vehicle facing wall 34 comprises an air inlet 35. The air inlet 35 may comprise one opening. The air inlet 35 may comprise a plurality of openings. The one or more openings of the air inlet 35 may have various shapes such as rectangular or circular. The air inlet 35 may be configured to be connected to an inside of the vehicle 10 such that air entering the housing 30 is taken from the inside of the vehicle 10.

The housing may further comprise side walls 38 connecting the inclined front wall 32 and the vehicle facing wall 34. The sidewalls 38 may connect the inclined front wall 32 and the vehicle facing wall 34 to form a closed channel for the air passing through the housing 30.

The housing 30 may further comprise a filter 40 configured to filter air entering the air inlet 35. The filter 40 may be arranged in connection with the air inlet 35. The filter 40 may be arranged just above the air inlet 35. The filter 40 may be arranged just below the air inlet 35. The air inlet 35 may comprise two layers and the filter 40 may be arranged in between the two layers. The filter 40 may be composed of fibrous or porous materials to remove particles such as dust and/or moist from the air entering the housing 30. The filter 40 may be disposable. The filter 40 may be washable and reusable. The filter 40 may have various shapes designed based on the shape of the air inlet 35 such as rectangular or circular.

The housing 30 further comprises a rear opening 36 forming a viewing opening for the camera 20. The rear opening 36 of the housing 30 may enclose the camera 20. The rear opening 36 is in fluid connection with the air inlet 35 such that air entering the air inlet 35 may exit the housing 30 through the rear opening 36. A cross-sectional dimension of the rear opening 36 may at least be twice a cross-sectional dimension of the camera 20. The area of the air inlet 35 may be at least 80% of the cross-sectional dimension of the rear opening 36. The rear opening 36 may be rectangular. The rear opening 36 may be circular or may have other shapes.

A typical size of the housing 30 is 5 to 20 cm along the main traveling direction A, 1 to 7 cm along the direction B away from the vehicle 10, and 3 to 10 cm along a direction perpendicular to the directions A and B.

The housing 30 may further comprise a sensor mounting bracket 50a, 50b. The sensor mounting bracket 50a, 50b may be arranged inside the hosing 30. The camera 20 may be mounted in the housing 30 by means of the sensor mounting bracket 50a, 50b. The sensor mounting bracket 50a, 50b may be positioned at a distance from the rear opening 36. The distance may preferably be at least 10% of the cross-sectional dimension of the rear opening 36. The camera 20 may hence be preferably mounted at a distance from the rear opening.

The housing 30 may further comprise a vehicle mounting bracket. The vehicle mounting bracket may be arranged outside the hosing 30. The housing 30 may hence be mounted on the vehicle 10 by means of the vehicle mounting bracket.

The person skilled in the art realizes that the present invention by no means is limited to the preferred embodiments described above. On the contrary, many modifications and variations are possible within the scope of the appended claims.

For example, the housing 30 may further comprise a flushing arrangement configured to flush a cleaning liquid onto the sensor 20. The flushing arrangement may therefore clean the sensor if needed.

Additionally, variations to the disclosed embodiments can be understood and effected by the skilled person in practicing the claimed invention, from a study of the drawings, the disclosure, and the appended claims.

The invention claimed is:

1. A sensor assembly configured to be mounted on a vehicle, the sensor assembly comprising:
    a sensor; and
    a housing configured to house the sensor, the housing comprising:
    an inclined front wall configured to face a main traveling direction of the vehicle and a direction away from the vehicle,
    a vehicle facing wall configured to face towards the vehicle and to be arranged adjacent the vehicle, the vehicle facing wall comprising an air inlet, and
    a rear opening forming a viewing opening for the sensor, the rear opening being in fluid connection with the air inlet such that air entering the air inlet exits the housing through the rear opening,
    wherein a smallest cross-sectional dimension of the rear opening in directions perpendicular to the main traveling direction of the vehicle is at least twice a largest cross-sectional dimension of the sensor in directions perpendicular to the main traveling direction of the vehicle.

2. The sensor assembly according to claim 1, wherein the housing further comprises a filter configured to filter air entering the air inlet.

3. The sensor assembly according to claim 1, wherein the rear opening of the housing encloses the sensor.

4. The sensor assembly according to claim 1, wherein the inclined front wall has an angle in a range from 10° to 40° with respect to the main travelling direction of the vehicle.

5. A sensor assembly configured to be mounted on a vehicle, the sensor assembly comprising:
    a sensor; and
    a housing configured to house the sensor, the housing comprising:
    an inclined front wall configured to face a main traveling direction of the vehicle and a direction away from the vehicle,
    a vehicle facing wall configured to face towards the vehicle and to be arranged adjacent the vehicle, the vehicle facing wall comprising an air inlet configured to let in ambient air, and
    a rear opening forming a viewing opening for the sensor, the rear opening being in fluid connection with the air inlet such that air entering the air inlet exits the housing through the rear opening;
    wherein the air inlet comprises a plurality of openings.

6. The sensor assembly according to claim 1, wherein the housing further comprises at least a mounting bracket positioned at a distance from the rear opening, the distance preferably being at least 10% of a cross-sectional dimension of the rear opening.

7. The sensor assembly according to claim 1, wherein the housing further comprises side walls connecting the inclined front wall and the vehicle facing wall.

8. A sensor assembly configured to be mounted on a vehicle, the sensor assembly comprising:
    a sensor; and
    a housing configured to house the sensor, the housing comprising:
    an inclined front wall configured to face a main traveling direction of the vehicle and a direction away from the vehicle,
    a vehicle facing wall configured to face towards the vehicle and to be arranged adjacent the vehicle, the vehicle facing wall comprising an air inlet, and a rear opening forming a viewing opening for the sensor, the rear opening being in fluid connection with the air inlet such that air entering the air inlet exits the housing through the rear opening;

wherein the air inlet is configured to be connected to an inside of the vehicle such that air entering the housing is taken from the inside of the vehicle.

\* \* \* \* \*